(12) United States Patent
Zehavi et al.

(10) Patent No.: US 7,713,355 B2
(45) Date of Patent: May 11, 2010

(54) SILICON SHELF TOWERS

(75) Inventors: Ranaan Zehavi, Sunnyvale, CA (US); Reese Reynolds, Los Gatos, CA (US)

(73) Assignee: Integrated Materials, Incorporated, Sunnyvale, CA (US)

( * ) Notice: Subject to any disclaimer, the term of this patent is extended or adjusted under 35 U.S.C. 154(b) by 445 days.

(21) Appl. No.: 11/364,530

(22) Filed: Feb. 27, 2006

(65) Prior Publication Data
US 2006/0249080 A1 Nov. 9, 2006

Related U.S. Application Data

(60) Provisional application No. 60/677,391, filed on May 3, 2005.

(51) Int. Cl.
C23C 16/00 (2006.01)
(52) U.S. Cl. ..................................................... 118/728
(58) Field of Classification Search ................. 118/715, 118/728
See application file for complete search history.

(56) References Cited

U.S. PATENT DOCUMENTS

| | | | |
|---|---|---|---|
| 5,192,371 A | | 3/1993 | Shuto et al. ................. 118/728 |
| 5,219,079 A | * | 6/1993 | Nakamura ............... 211/41.18 |
| 5,472,099 A | * | 12/1995 | Terashima ............... 211/41.18 |
| 6,056,123 A | | 5/2000 | Niemirowski et al. ....... 206/711 |
| 6,062,853 A | * | 5/2000 | Shimazu et al. ............. 432/258 |
| 6,425,168 B1 | | 7/2002 | Takaku ....................... 29/25.01 |
| 6,450,346 B1 | * | 9/2002 | Boyle et al. .............. 211/41.18 |
| 6,455,395 B1 | | 9/2002 | Boyle et al. |
| 2003/0119248 A1 | * | 6/2003 | Mistry et al. ................. 438/217 |
| 2004/0213955 A1 | | 10/2004 | Boyle et al. |

FOREIGN PATENT DOCUMENTS

| | | |
|---|---|---|
| EP | 0 713 245 | 11/1995 |
| JP | 05-175319 | 12/1991 |
| JP | 10-321543 | 10/1996 |

* cited by examiner

*Primary Examiner*—Parviz Hassanzadeh
*Assistant Examiner*—Maureen Gramaglia
(74) *Attorney, Agent, or Firm*—Charles S. Guenzer

(57) ABSTRACT

A silicon shelf tower for hatch thermal processing of silicon wafers in a vertical furnace. The tower includes at least three silicon legs joined to bases and having a vertical arrangement of slots. Silicon shelves are detachably loaded by sliding them through the slots in the side legs and into the slot of the back leg. A interlocking mechanism detachably locks the shelves to the back leg while the slots in the two side legs laterally constrains the shelves. The shelves include cutouts to allow a robot paddle to load and unload wafers to the shelves. Circular holes in the shelves relieve stress and prevent wafer sticking Preferably, the shelves are formed from randomly oriented polycrystalline silicon. The shelves and towers can alternatively be made of other materials such as quartz and silicon carbide.

8 Claims, 6 Drawing Sheets

SILICON SHELF TOWERS

RELATED APPLICATION

This application claims benefit of provisional application 60/677,391, filed May 3, 2005.

FIELD OF THE INVENTION

The invention relates generally to thermal processing of substrates, such as silicon wafers. In particular, the invention relates to towers supporting multiple substrates in a vertical furnace and auxiliary support structures used therein.

BACKGROUND ART

Batch processing of silicon wafers continues to be an important commercial process. Typically, a wafer tower, often called a boat, is placed within a vertical furnace and holds a large number of silicon wafers in a vertical stack with a horizontal orientation of the principal surfaces of the individual wafers for thermal processing of the wafer within the furnace. The thermal process may include flowing into the furnace a process gas, such as a precursor gas to deposit a layer on the wafers by chemical vapor deposition (CVD), for example, of silane to form a layer of polysilicon or additionally of nitrogen to form a layer of silicon nitride. Oxygen or nitrogen may be flowed in to thermally oxidize or nitride the wafers. Hydrogen may be used as a reducing agent for a high-temperature anneal. In other applications involving a non-reactive anneal of the wafers, the furnace may be filled with an inert gas. A high-temperature anneal in an inactive ambient may act as an implant anneal to activate implanted ions or to generally anneal the silicon wafer. On the other hand, CVD is typically performed at lower temperatures.

Quartz towers have long been used in such furnaces. However, as processing temperatures continue to rise, now often exceeding 1000° C. and even 1250° C., quartz has exhibited deleterious sagging at the higher temperatures and also is now considered a somewhat dirty material in view of the increasing purity levels required for advanced integrated circuits. Silicon carbide towers have been increasingly used for high-temperature processing. However, sintered silicon carbide is also a dirty material and CVD silicon carbide is expensive as a bulk material and is not completely effective as a surface coating over sintered silicon carbide.

Recently silicon ladder towers have been introduced for supporting silicon wafers, as disclosed by Boyle et al. in U.S. Pat. No. 6,450,346, incorporated herein by reference. By ladder tower is meant that each of the wafers is directly supported on respective teeth integrally formed on three or four legs of the tower held between two tower bases. At least the legs of these towers include structural members composed of elemental silicon, that is, substantially more than 50% or even more than 90% of all of the silicon atoms in the structural member is bonded to other silicon atoms and not to other elements. Elemental silicon is readily available in forms having purity levels above 99 atomic percent (at %). Silicon intended for the semiconductor industry is available in very pure forms having purity levels well above 99.99 at %. Thus, silicon used for structural members in support fixtures has the advantages over quartz and silicon carbide of very high purity and no differential thermal expansion relative to the supported silicon wafers.

A major problem facing high-temperature processing of silicon wafers for advanced integrated circuits is the creation of dislocations such as slip defects. Silicon towers have been observed to produce few or no such defects. However, an alternative approach applied to the more conventional quartz or silicon carbide towers uses wafer rings composed of quartz or silicon carbide supported by the legs of the tower and the rings in turn support the wafers along a substantial periphery of the wafer. There are a number of configurations, often referred to as ring boats, boat rings, or towers with wafer support rings. Often, the ring is welded or otherwise fixed to the tower. A closed-ring structure, however, has the problem of the difficulty of loading and unloading wafers to and from the rings. Furthermore, quartz and silicon carbide when used in rings magnify and continue to present their many problems related to differential thermal expansion and impurities. The coefficient of thermal expansion for silicon is 100 times greater than that for quartz and silicon exhibits substantially better thermal conductivity. Most prior art rings have a complex cross section which significantly increases the cost of fabricating them.

SUMMARY OF THE INVENTION

In one embodiment of the invention, silicon shelves are detachably loaded onto support teeth on multiple levels of a tower. The tower is preferably made of silicon but possibly from silicon carbide, quartz or other material. The shelf has a generally flat surface and may include an insert for allowing entry of the wafer paddle during wafer transfer. The shelf optionally includes a number of curved, preferably circular holes to relieve stress and the paddle insert has curved corners. One or more of the circular holes may be used to interlock with one or more notches in the tower legs.

The shelves are preferably made from polycrystalline silicon. Although cast silicon may be used, a preferred silicon is Czochralski grown polysilicon, most particularly using a seed that is randomly oriented polycrystalline silicon. Such a seed may directly or indirectly be derived from virgin polysilicon grown by CVD.

However, many aspects of the invention may be practiced with shelves or legs made of other materials such as quartz, silicon carbide, or silicon-impregnated silicon carbide.

The shelves may include a passive, preferably gravitational, interlocking mechanism with the tower. For example holes formed in the shelf leave a strap along the shelf periphery which fit into a notch formed at the bottom of the slots in one or more legs of the tower, for example, the back leg of a three leg tower. When the shelves are loaded into the tower, they gravitationally drop into the notches. The sides of the shelves may be flattened along the insertion to be centered by corresponding slots in two side legs. An alternate locking mechanism forms a step on at least one flat lateral side. The wide portion of the step is located nearer the back of the shelf and is inserted over a ledge at the back of the slot. In the operational position, the step falls off the back of the ledge and is gravitationally locked to it.

The invention includes circular rings without necessarily any paddle insert composed of silicon and used either with silicon towers or towers of other materials such as SiC or quartz.

DETAILED DESCRIPTION OF THE PREFERRED EMBODIMENTS

One aspect of the invention includes shelves inserted into vertically arranged slots in a support tower and each supporting a wafer. In contrast to conventional towers which support wafers at only three or four locations, shelves may support the wafers over a substantial fraction of the area of the wafers. Thereby, sagging of wafers during high-temperature processing is reduced and local contact loads are reduced, thereby minimizing one cause of slip in the wafers.

Figure 1:
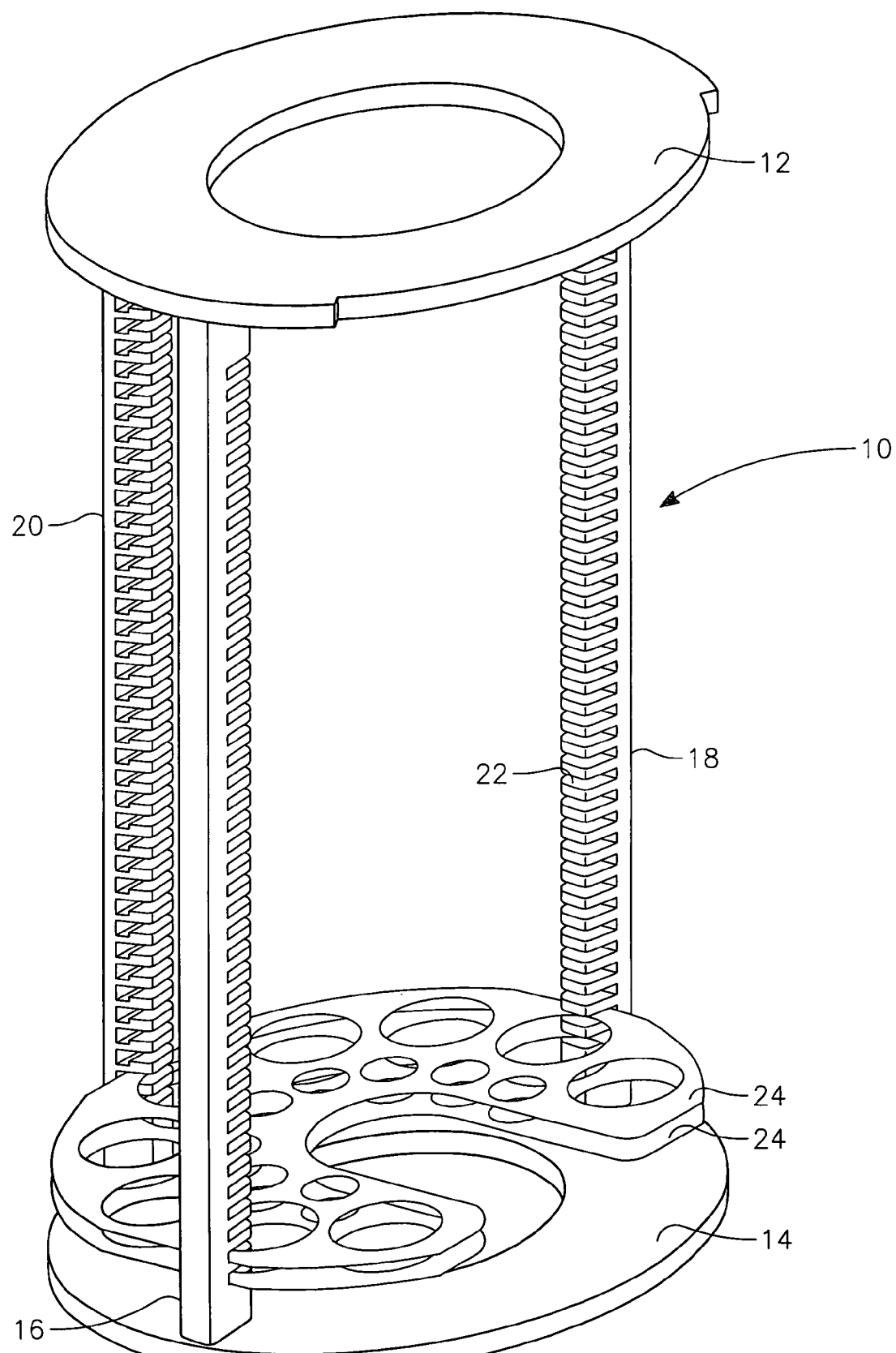
FIG. 1 is an orthographic view illustrating a tower and multiple shelves supported on the tower legs.

As illustrated in the orthographic view of FIG. 1, a support tower 10 includes an upper base 12 and a lower base 14. Two side legs 16, 18 and one back leg 20 are fixed to the two bases 12, 14. Each of the vertically extending legs 16, 18, 20 are formed with horizontally extending slots 22 arranged vertically along the legs 16, 18, 20. Multiple sets of slots 22 in the tower 10 support a corresponding number of wafers in a batch annealing furnace. Although the legs and bases of the tower 10 may be composed of conventional materials such as quartz, silicon carbide, and silicon-impregnated silicon carbide, it is preferred that they be composed of high-purity silicon. Furthermore, the legs 16, 18, 20 are preferably composed of electronic grade silicon (EGS), alternatively known as virgin polysilicon (virgin poly). Boyle et al. describe the machining of virgin poly legs in U.S. Pat. No. 6,455,395. Boyle et al. describe joining the legs to the bases with a spin-on glass adhesive in Patent Application Publication US 2004/0213955 A1. These two documents are incorporated herein by reference. Boyle et al. describe ladder towers which directly support wafers on long inclined teeth extending from the legs and supporting the wafer on their distal ends. In contrast, the slots 22 of the illustrated tower 10 are relatively shallow and may have flat bottoms though it is possible to provide structure to the bottom of the slots 22.

Figure 2:
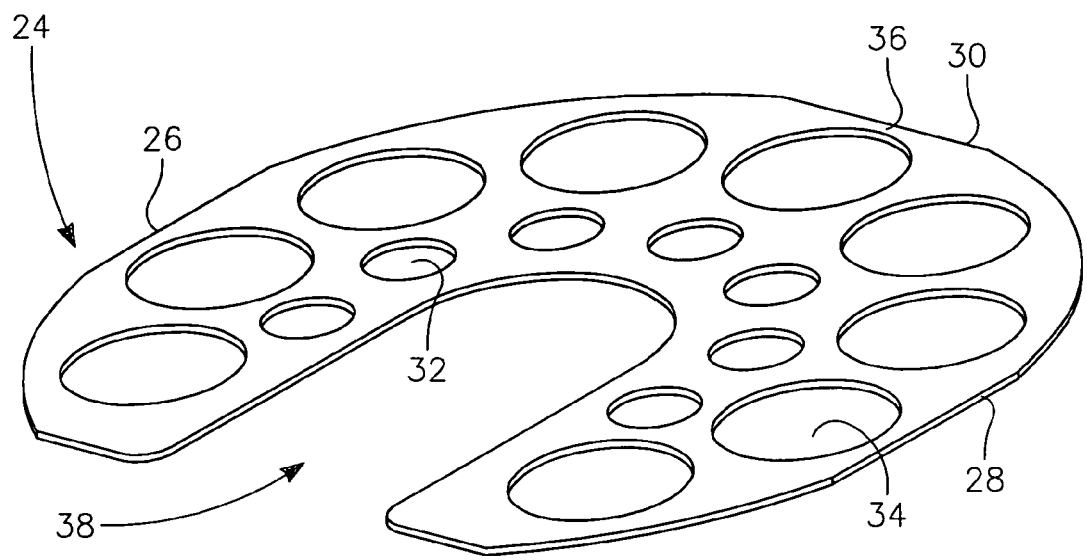
FIG. 2 is an orthographic view of a shelf.

A generally planar horizontally extending shelf 24 may be inserted into each of the sets of slots 22 for supporting a wafer inside of the three legs 16, 18, 20. As further illustrated in the orthographic view of FIG. 2, each shelf 24 has a somewhat circular shape. However, its outer periphery is preferably shaped to have two parallel flat lateral sides 26, 28 to slide through the slots 22 of the side legs 16, 18 and a flat back side 30 to slide into and preferably engage the slot 22 of the back leg 20. Once the back side 30 is engaged and interlocked with the back slot 22, the lateral sides 26, 28 of the shelf 24 are confined by the side slots 22. A series of curved, preferably circular holes, for example, including smaller inner holes 32 and larger outer holes 34 may be core drilled through the shelf 24. The number, distribution, and sizes of the holes 32, 34 may be varied in different designs. The holes 32, 34 are useful to relieve stress in the thin shelves 24, to reduce thermal mass, and to allow the furnace ambient to reach a substantial portion of the wafer backside, thereby preventing the wafers from sticking to the shelves 24. The planar shape of the shelf 24 allows it to be economically machined from slices of material, especially silicon, similar to wafers.

Advantageously, one of the larger holes 34 is aligned with the back leg 20 at the center of the flattened back side 30 to form a narrow strap 36 used for interlocking with the back leg 20, as will be described later. The shelf 24 is also formed with a cutout 38 that extends from the front to in back of a center 40 of the shelf 24 and has a semi-circular back to allow a robot blade to load and unload a wafer to and from the shelf 24 while the shelf 24 is in turn supported by the tower 10 as the paddle passes downwardly through the cutout 38. If vacuum chucking is used in the robot blade, the blade can be shortened and the cutout depth reduced so that it does not extend to the center 40.

Figure 3:
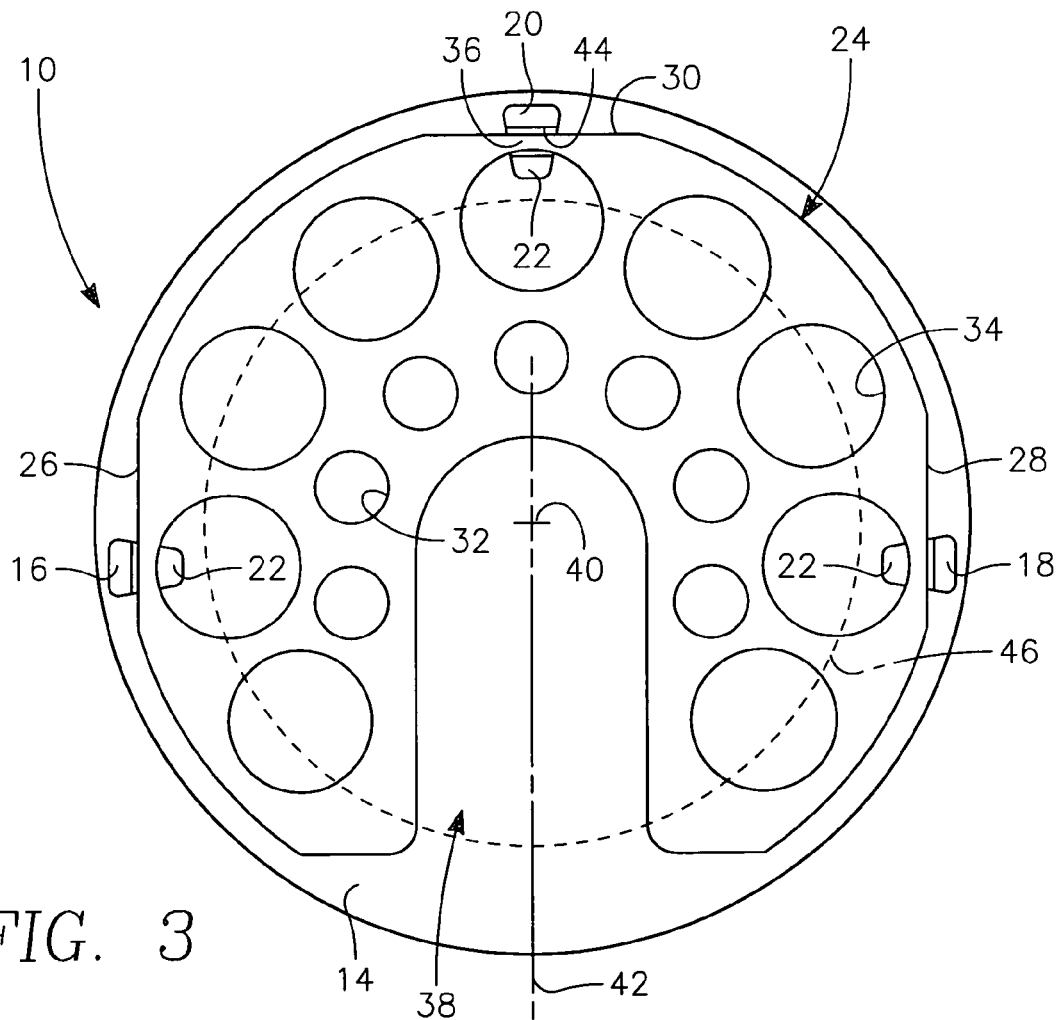
FIG. 3 is a sectioned plan view of a shelf and the lower part of the tower supporting it.

As shown in the sectioned plan view of FIG. 3, the side legs 16, 18 are located slightly forward (towards the wafer and shelf insertion direction) of the center 40 of the tower 10 with their slots 22 extending parallel and equally spaced from a median 42 of the shelf 24 and thus parallel and just outside of the flattened sides 26, 28 of the shelf 24 they support. Preferably, the median 42 acts as a line of symmetry for the shelf 24. The sides of the shelf cutout 38 are also parallel and equally spaced from the median 42 although other shapes of the cutout 38 are possible dependent upon the form of the robot blade. The slot 22 of the back leg 20 is centered on and extends perpendicularly to the median 42 of the shelf 24, which is also the wafer and shelf loading axis The back leg 20 is formed with a notch 44 extending downwardly along the back leg 20 and horizontally along the flattened back side 30 of the shelf 24 to capture the narrow strap 36 of the shelf 24. An unillustrated robot paddle fits within the cutout 38 and moves along the loading axis 42 to transfer a wafer 46 onto and from the shelf 24. The robot paddle holds the wafer 46 above the shelf 24 during horizontal movement in and out along the loading axis 42. Either the robot paddle or the tower 10 as a whole is raised and lowered to effect the actual transfer between the paddle and the top surface of the shelf 24. The empty paddle is horizontally moved while vertically disposed below the top surface of the shelf 24.

Figure 4:
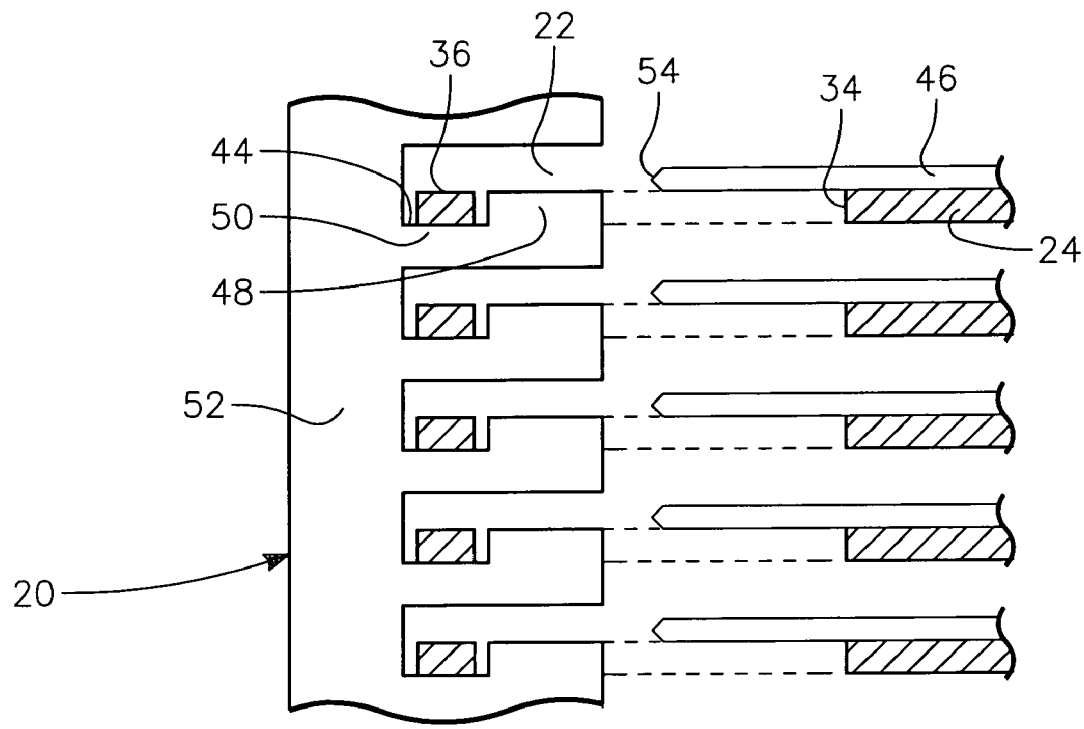
FIG. 4 is a elevation view of the back leg of the tower, shelves supported by and interlocked with the back leg, and wafers supported on the shelves.
Figure 5:
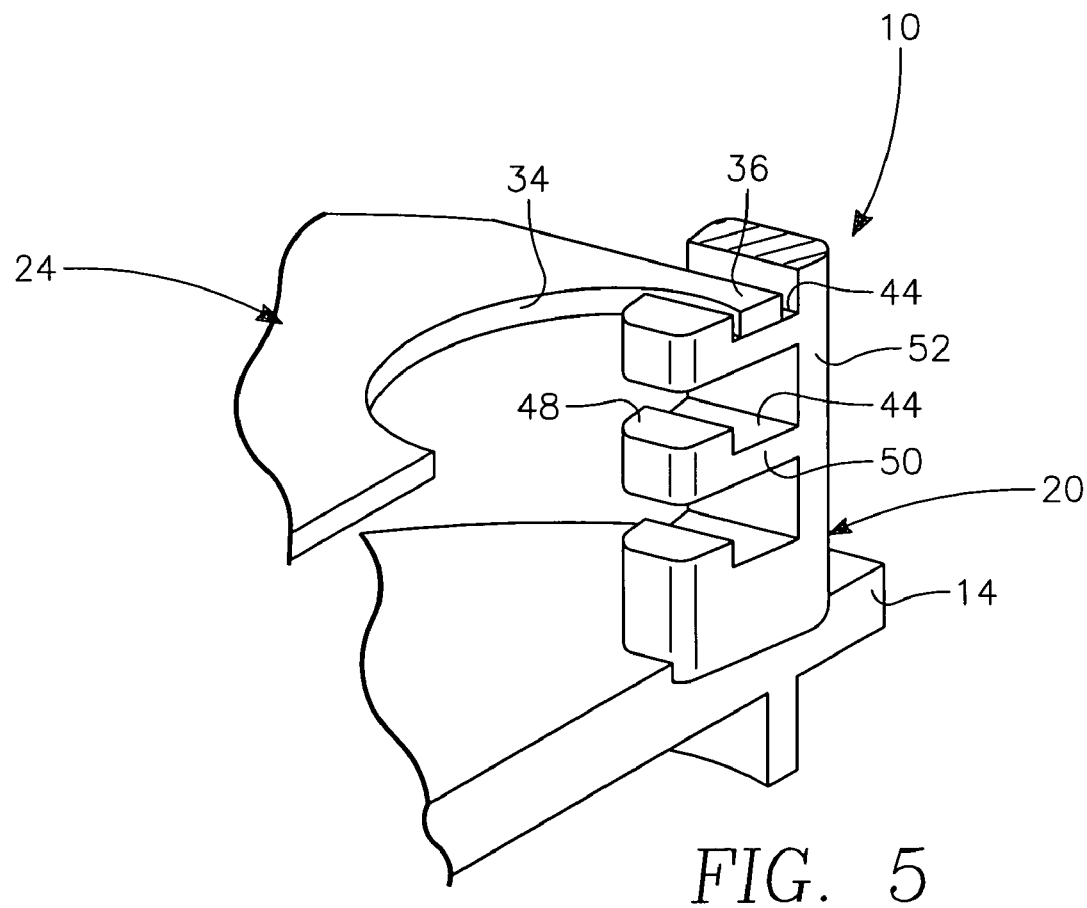
FIG. 5 is an orthographic view of the tower structure of FIG. 4 including its base.

As shown in the cross-sectional view of FIG. 4 and the sectioned orthographic view of FIG. 5, each notch 44 on the back leg 20 is formed as a depression in back of a raised hook 48 rising from a finger 50 extending inwardly from a vertical stem 52 of the back leg 20. In contrast, the slots 22 of the side legs 16, 18 may have flat bottoms. The bottom of the notch 44 of the back leg 20 is level with the bottoms of the corresponding slots 22 of the other two legs 16, 18 to hold the respective shelf 24 horizontally in a three-point support. Each shelf 24 is loaded by sliding it along the loading axis 42 from the front of the tower 10 through the slots 22 of the side legs 16, 18 until the strap 36 passes over the hook 48 and is lowered into the notch 44 and is gravitationally held there, thereby substantially locking the shelf 24 in the forward and backward direction. The shelf 24 is substantially locked in the lateral direction by the sides of the slots 22 in the side legs 16, 18 abutting against the flattened shelf sides 26, 28. The interlocking is passive and does not require any additional fixing means. Although it is not crucial, the thickness of the shelf 24 generally corresponds to the depth of the notch 44.

Other interlocking mechanisms may be included on the side legs 16, 18. It is possible to provide interlocking mechanisms on the side legs 16, 18 but they are not necessary in most cases.

Figure 6:
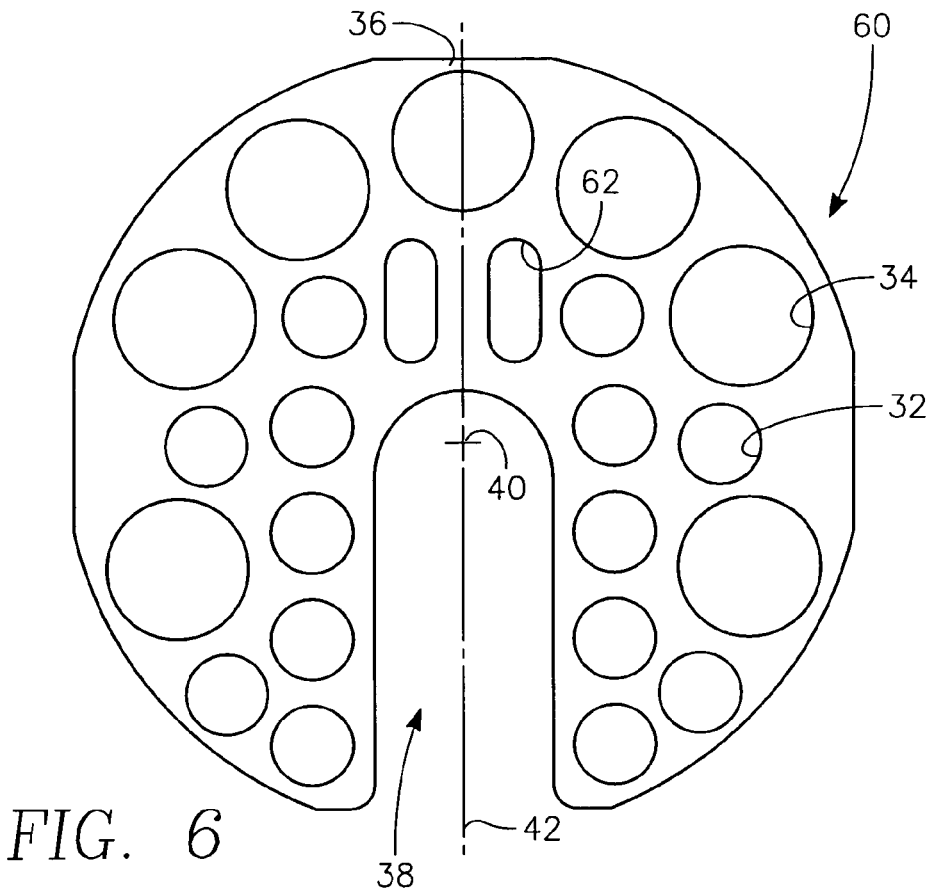
FIG. 6 is a plan view of a different distribution of holes in a shelf.

An alternative design of a shelf 60 illustrated in the plan view of FIG. 6 substitutes two elongated holes 62 spaced from the median 42 for the medial small hole 32 of FIG. 3 located on the median 42. This configuration reduces fracture along the median 42.

Figure 7:
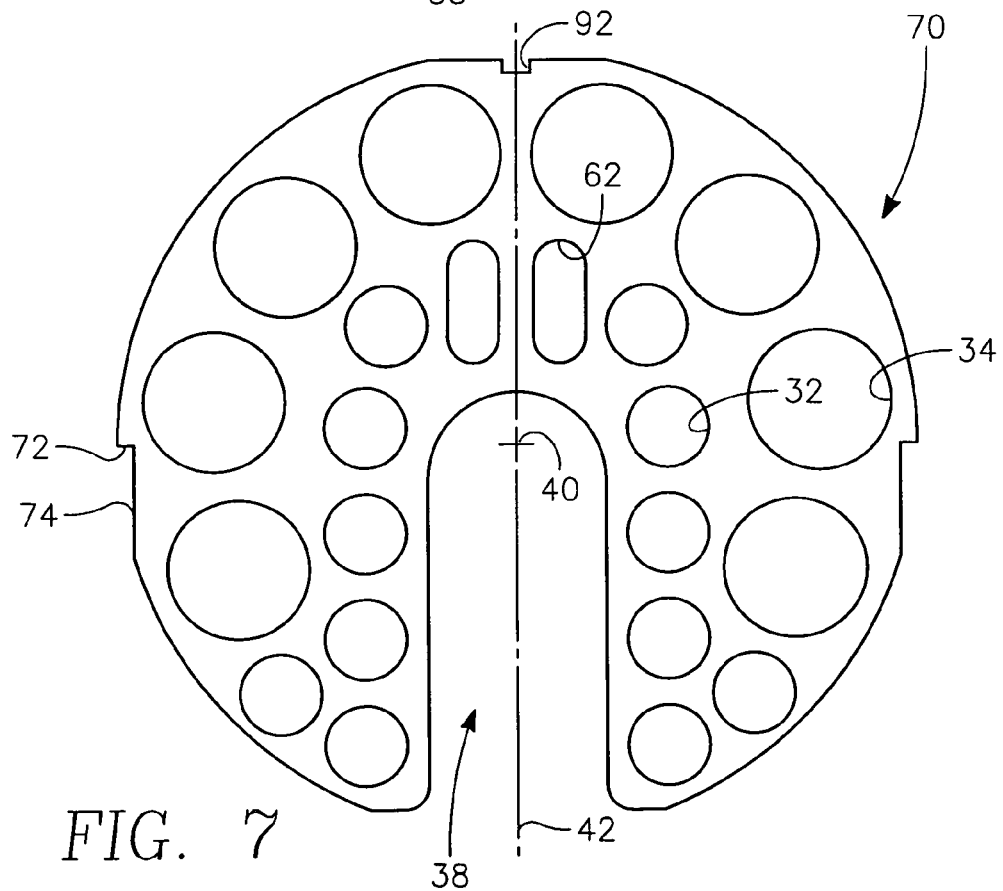
FIG. 7 is a plan view of another shelf employing a side locking mechanism.
Figure 8:
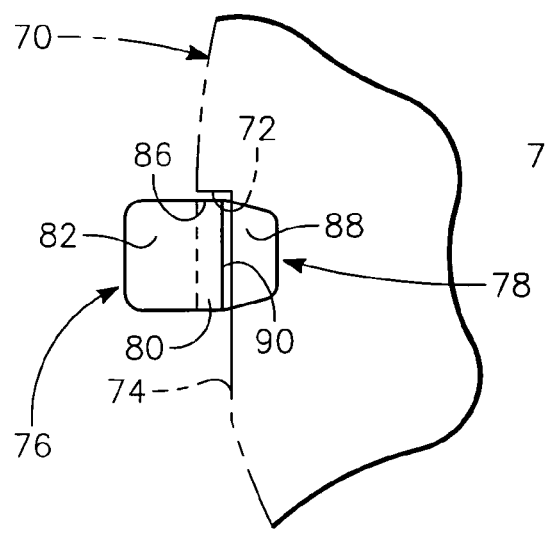
FIG. 8 is a partially sectioned plan view of the shelf of FIG. 7 interlocked with a side leg.
Figure 9:
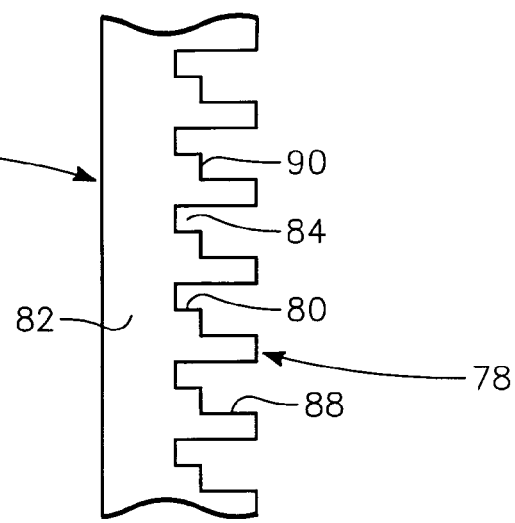
FIG. 9 is a cross-sectional view of the side leg of FIG. 8

A yet further alternative design of a shelf 70 illustrated in the plan view of FIG. 7 includes a different gravitational and passive interlocking mechanism. Outwardly projecting steps 72 are formed in back of front flattened lateral sides 74 of the shelf 70. When the shelf 70 is mounted on the tower, the steps 72 are positioned at the back edges of two opposed side legs 76, illustrated in the top partially sectioned plan view of FIG. 8 and the cross-sectional side view of FIG. 9. Each finger 78 of the side leg 76 includes a ledge 80 in front of a leg stem 82 with a sufficient vertical gap 84 above the ledge 80 and with a sufficient horizontal spacing between the leg stems 82 of the two side legs 76 to allow the shelf 70 to slide over the ledge 80 and then to fall with the shelf step 72 closely adjacent a back side 86 of the ledge 80 to be interlocked therewith while the flattened back of the shelf 70 encounters the back leg. The finger 78 also includes an outer shelf support surface 88 which supports the shelf 70 after it has fallen in back of the ledge 80. The front flattened side 74 of the shelf 70 is aligned to a radially inner side of the ledge 80.

Because further interlocking is not required in the back leg, the back-leg notch 44 of FIGS. 4 and 5 is no longer required so that the slots of the back leg may have flat bottoms that are vertically aligned with the shelf support surface 88 of the side legs so that the shelf 70 is interlocked by the side ridges 80 against the stem 82 of the back leg. On the other hand, the back leg can be made the same as the side legs 76 so that the shelf 70 is interlocked against the inner side 90 of the ledge 80 of the back leg. Also, the back of the shelf 70 does not require a flattened side since a curved periphery can contact the back leg. Therefore also, the strap 36 can be eliminated and all the large holes 34 can be moved away from the shelf median 42. However, lateral and rotational alignment is improved if, as illustrated in FIG. 7, a recess 92 is formed at the back of the shelf to engage the sides of the ledge 80 of the back leg. The recess 92 has a shape conforming to the portion of the back leg it engages. The back recess 92 improves the interlocking and eliminates the need for an otherwise flattened back side. Also, similar recesses can be substituted for the single steps 72 on the lateral sides to engage both sides of the ledges 80 of the side legs.

The large outer holes 34 are realigned in the shelf 70 of FIG. 7 so that no hole falls on the loading axis 42. That is, the shelf 70 is continuous along the loading axis 42 (which is the median of the shelf 70) from back of the paddle cutout 42 to the back of the shelf 70. This region is subject to some of the highest mechanical stresses imposed on the shelf and hence needs to be particularly strong to resist fracturing.

It is appreciated that in this embodiment as well as others the tower may include two back legs as well as two side legs. It is also appreciated that the side leg locking mechanism can be implemented on only one of the side legs.

Figure 10:
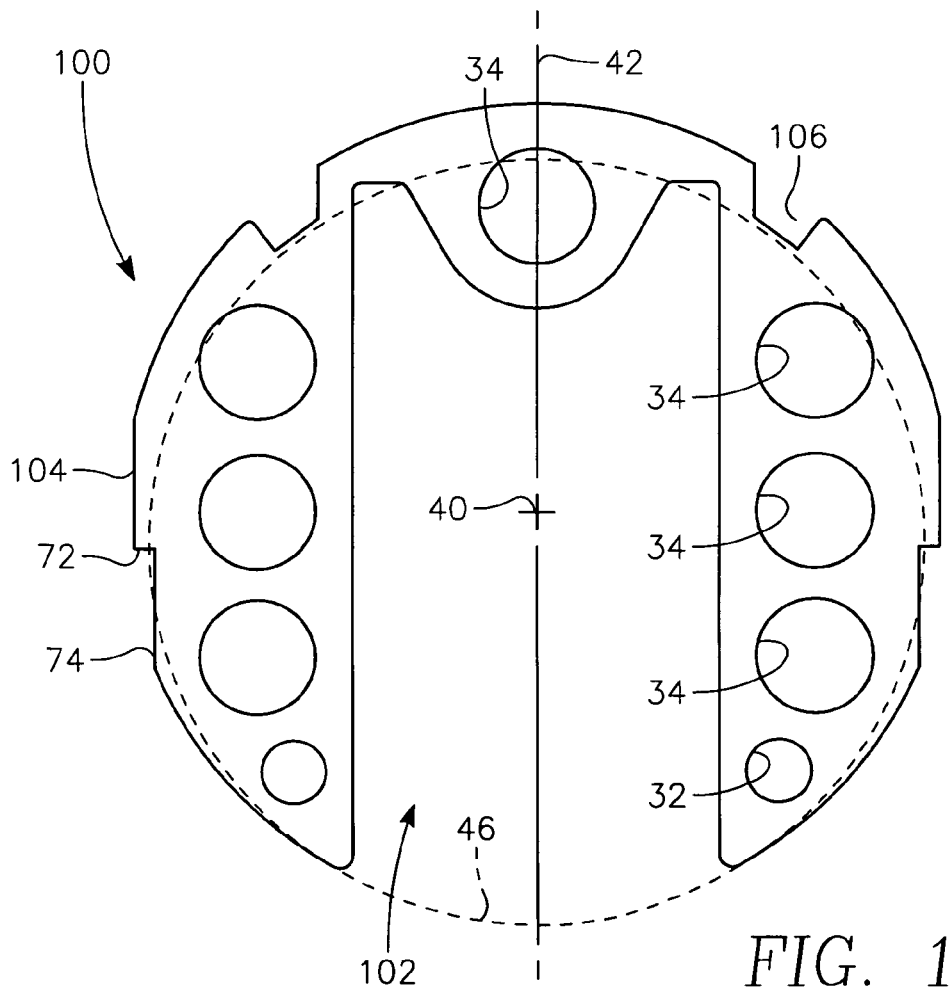
FIG. 10 is a plan view of yet another shelf accommodating a larger wafer paddle.

Yet another design of a shelf 100 illustrated in the plan view of FIG. 10 has a larger paddle cutout 102 having a pattern generally following the outline of a larger wafer paddle. It also includes the interlocking mechanism previously described with reference to FIGS. 7-9 and including the steps 72 in back of the front flattened sides 74 which interlock with the two side legs extending perpendicularly toward the loading axis 42. The shelf 100 is formed with back flattened sides 104 in back of the steps 72, which allow the side legs to be brought closer to the wafer 46 and further to the front of the wafer 46, thus better distributing the support around the periphery of the wafer 46. The shelf 100 is intended for use with a wafer support tower having four support legs including the two side legs and two back legs extending radially toward the center 40 almost to the paddle cutout 102. Stems of the back legs are partially accommodated within respective indentations 106 in the shelf 100.

It is anticipated that once the shelves have been detachably loaded and locked onto the tower, they remain there for a large number of processing cycles. In each processing cycle, the wafers 46 are transferred onto the shelves generally centered about the tower center 40 and with the wafers' beveled edges 54 located radially inwardly from the tower legs although the centering is not critical in view of the wide support areas. In typical commercial practice, the tower either remains horizontally stationary and a furnace canister and associated bell jar and liner are lowered over the tower 10 or the tower 10 is raised into the stationary furnace canister. The wafers 46 are then thermally processed in the furnace containing the tower 10 and supported wafers 46. After processing, the tower and oven canister are separated and the wafers 46 are removed from the shelves 24 and a new processing cycle begins.

The maximum diameter of the shelf is larger than the diameter of the wafers 46 being supported in the tower 10. The wafer diameter is currently shifting from 200 mm to 300 mm for most commercial production and 450 mm is being forecast for the future, but other wafer diameters are possible. Advantageously, as shown in FIG. 3, the periphery of the wafer 46 overlies the large outer holes 34. The wafers 46 supported on the shelves preferably do not extend into the areas of the tower legs so that the outer holes 34 only partially underlie the wafers 46. However, in the design of FIG. 10, portions of the outer periphery of the wafers 46 may overlie support areas of the legs although this area may include the wafers' beveled edges 52 so there is no direct wafer contact to the tower.

Figure 11:
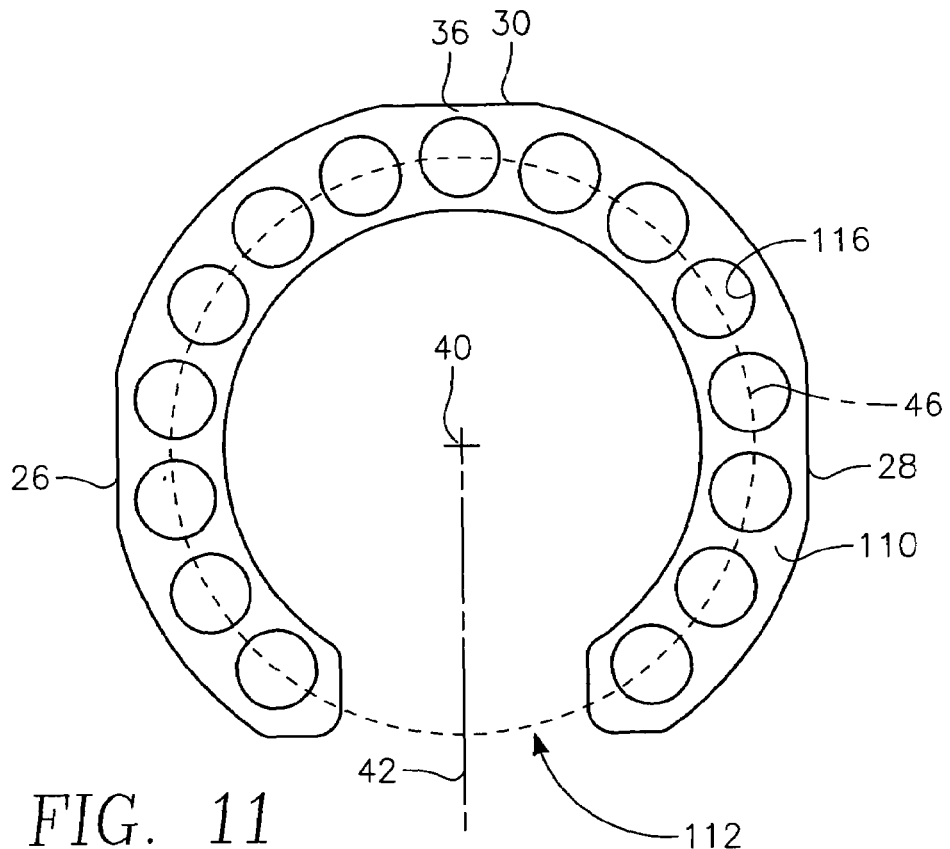
FIG. 11 is a plan view of an open ring for supporting a wafer.
Figure 12:
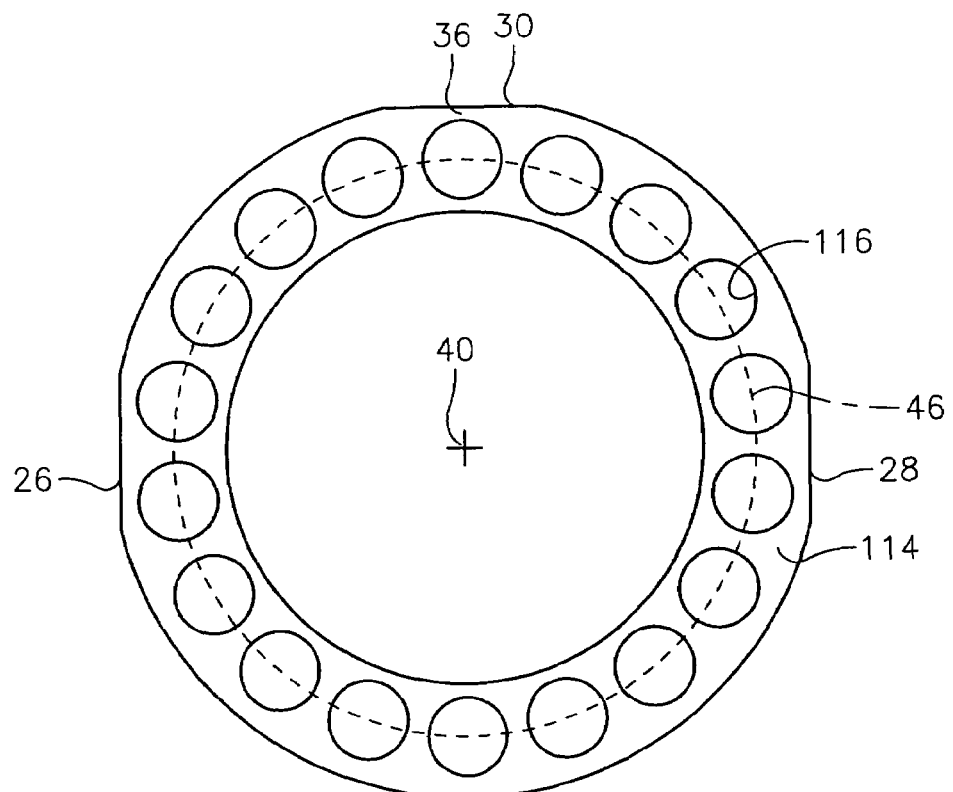
FIG. 12 is a plan view of a closed ring.

Other forms of the shelves and the tower legs and of their optional interlocking mechanism may be chosen. The number of legs may be reduced to two or increased to four or more. The form of the described shelves included support areas extending over a substantial fraction of the wafer 46, that is, more of a tray-like structure. Alternatively to a large shelf, a smaller open washer-shaped ring 110 illustrated in the plan view of FIG. 11 having an opening 112 for the wafer paddle to be lowered or a smaller closed washer-shaped ring 114 illustrated in the plan view of FIG. 12 supports the outer lower surface of the wafer 46 on the generally planar inwardly disposed upper surface of the ring 110, 114, thus reducing the stress on the supported areas of the wafer 46. Preferably, the rings 110, 114 include the flattened lateral sides 28 and back side 30. Optional holes 116 may be included in either of the rings 110, 112, and preferably the outer periphery of the support wafer 46 overlies the holes 116 so that the interlocking strap 36 is formed adjacent the flattened back side 30.

Each ring 110, 112 supports a wafer 46 on its generally flat upper surface. Multiple rings 110, 112 in turn are supported on the back and side legs of the shelf tower 10, of which there may be three or four. The closed ring 112 introduces difficulties with wafer transfer which have been addressed in the prior art. The illustrated rings 110, 112 use the back leg interlocking mechanism of FIGS. 3-5 but the side leg interlocking mechanism of FIGS. 7-9 or other interlocking mechanism may be substituted. A ring may be considered as a special form of a shelf having a more open structure confined to the peripheral area of the wafers (outer 50% of the wafer radius). On the other hand, the shelves of FIGS. 3, 6, and 7 also support portions of the inner area of the wafers (inner 50% of the wafer radius). The design of FIG. 10 may be considered intermediate a shelf and a ring.

The thickness of the shelves (including rings) may be chosen according to need. The thickness may lie within a preferred range of 0.5 to 4 mm or a more preferred range of 1 to 2 mm. However, it is anticipated that they will be at least as thick as present commercial wafers, that is, at least 0.775 mm. It is felt that a thickness of 1 mm is most desirable, but a thickness of up to 2 mm may be needed for increased mechanical strength and ruggedness in repeated use. Thicknesses of greater than 3 mm provide greater strength but impact the capacity of the tower 10 and hence the processing throughput.

The shelves may be formed of conventional tower materials including quartz, silicon carbide, and silicon-impregnated silicon carbide and may be used with towers of these conventional tower materials and still provide many advantages of the shelf structure and operation of the invention. However, silicon is preferred as the shelf material because of its high purity level and lack of differential thermal expansion relative to silicon wafers they support. Monocrystalline Czochralski-grown silicon is widely available because of its use in silicon wafers. However, monocrystalline silicon suffers some disadvantages. It is not commonly available in the larger diameters needed for processing 300 mm wafers, that is, diameters of greater than 300 mm. It is subject to chipping and fracture along cleavage planes under repeated use. It is relatively expensive. On the other hand, polycrystalline silicon is less expensive and less subject to chipping and fracture. Cast silicon forms as polycrystalline material that is more resistant to chipping although its purity is less than desired. Pure polycrystalline silicon can be grown in a Czochralski (CZ) process using a polycrystalline seed drawn from the end of ingot drawn in a CZ process faster than allows monocrystalline growth. However, both the seed and the resultant CZ ingot have semi-single polycrystalline structures in which crystallites are preferentially aligned perpendicular to the drawing direction, typically within a 20° range. As a result, semi-single silicon also tends to crack and cleave along the aligned crystallite sides and its strength is reduced for similar reasons. Virgin polysilicon would be an even better material but it is not generally available in large diameters.

The preferred silicon material for the shelves is randomly oriented polycrystalline silicon (ROPSi). Boyle et al. describe the growth of large-diameter ingots of randomly oriented polycrystalline silicon in U.S. patent application Ser. No. 10/328,438, filed Jan. 9, 2006, now published as U.S. patent application publication 2006/021118, and incorporated herein by reference. The randomly oriented ingot is grown by the Czocharalski method by drawing a polycrystalline seed from a silicon melt. To achieve the randomly oriented polycrystalline, the seed is itself randomly oriented polycrystalline silicon. Such seeds may be formed from pieces of virgin polysilicon grown by chemical vapor deposition (CVD) from pure silane, chlorosilane, or similar precursors. Alternatively, such seeds may be formed of randomly oriented Czochralski-grown polycrystalline silicon. For example, the seed may be traceable through one or more generations of Czochralski growth to a virgin polysilicon or CVD seed. Other polycrystalline seeds maybe used. In contrast, if a monocrystalline seed is pulled at high speed from the melt, the ingot is semi-single crystalline at the bottom, that is, polycrystalline with a preferred orientation within ±15 or 20° about a preferred crystallographic axis although it may be random about that axis. In contrast, ROPSi is randomly oriented in all directions with no preferred crystallographic axis. Czochralski-grown ROPSi has purity comparable to production wafers and the desired random orientation.

ROPSi silicon is particularly advantageous for the complex structure of the shelves repeatedly used in production because of its strength and resistance to fracture. Such strength is even more desired for the small peripheral rings 110, 114 of FIGS. 11 and 12.

The support surface of the shelf may be left substantially planar to distribute the load over a wider portion of the wafer, for example, greater than 25% even when holes are formed in the shelves. However, Blanchard grinding of the shelf principal surfaces may be used in shelf fabrication to provide sub-surface damage and pits and cracks, which promote adhesion to thick layers of deposited material. Further, it may be advantageous to etch the shelves in a mixed acid etch, for example, of nitric and acetic acids or hydrogen peroxide, to relieve stress and remove machining damage in the polycrystalline material. Other cleaning processes, for example, those developed for silicon wafers, may be applied to the silicon shelves. However, a subsequent bead blasting may be preferred to avoid a mirror finish on the support surface, which could create a Van der Waal's bonding problem with the processed wafers.

It is possible to fix the shelves to the tower by means of adhesive, fusing, or other means. Fixed boat rings are well known and provide a rigid structure for wafer transfer. However, detachable shelves offer several advantages. In any case, after a few cycles of deposition of nitride or polysilicon, the shelves are likely to be stuck to the tower legs by deposited material bridging the gaps between them. Eventually the deposited material is likely to build up to an unacceptable thickness beyond which flaking and particles begin to reduce yield. Shelf towers or even ring boats are relatively expensive even when implemented in quartz or silicon carbide. It is desirable to refurbish the support fixtures by etching away the deposited material. However, if one of the rigidly attached shelves breaks during cleaning, it is almost impossible to repair the tower, at least to its original capacity. On the other hand, if the shelves are detachable after etching the deposited material, any shelf broken during cleaning can be replaced by a new shelf while those that remain intact can be reused. The same type of replacement is possible if a detachable shelf is broken during use, such as by a malfunctioning robot. Yet further, if a tower breaks for whatever reason, many of the intact shelves might be salvaged.

The combination of silicon shelves and silicon towers greatly facilitates the cleaning. The entire assembly, if the shelves are temporarily bonded to the tower, can be dipped in dilute HF, which removes any oxide or nitride and frees the shelves without substantially etching the silicon support fixtures. On the other hand, the dilute HF would etch a quartz tower.

The use of silicon shelves provides the direct advantage of high-purity material in contact with the wafer and of no differential thermal expansion. Silicon also provides higher thermal conductivity than quartz. Silicon also is transparent to wavelengths out to several hundred microns while quartz becomes opaque at a few microns and silicon carbide is generally opaque to infrared radiation. Thus, silicon does not present a thermal mask. The improved thermal conductivity and infrared transparency of quartz promotes thermal equilibrium within the furnace. Although these advantages particularly apply to silicon shelves, they extend also to silicon towers.

Since the tower and its legs are no longer in direct contact with the wafer, it is possible to advantageously use silicon shelves and lower-cost quartz or carbide towers. However, the generally dirtier quartz and carbide tower and legs are still in the same chamber and thus still present a contamination issue and differential thermal expansion between the legs and shelves. Silicon shelves enable an all-silicon hot zone within a thermal furnace. The tower, shelves, gas injectors, and furnace liner may all be composed of silicon. Baffle wafers, if used, may also be composed of ROPSi silicon.

The invention thus provides various useful advances in shelf towers. The shelves, if desired, may be composed of the same material as the substrate being supported, thus minimizing differential thermal effects. The shelves may be detachably loaded onto the tower and detachably interlocked therewith, thereby simplifying cleaning and reducing long-term cost. Although towers and shelves are preferably all composed of silicon, especially randomly oriented polycrystalline silicon, many aspects of the invention apply to other materials.

The invention claimed is:

1. In combination with a tower having silicon legs extending between two silicon bases, two opposing legs having slots having raised ledges formed along the legs, a plurality of shelves configured to be individually detachably and passively interlocked with two of the legs opposing each other and capable of supporting respective vertically separated substrates for thermal processing in a thermal processing furnace at temperatures up to at least 1000° C., and consisting essentially of silicon, wherein each shelf comprises two opposed flattened outer lateral sides, the opposed flattened outer lateral sides each including a step, wherein each step falls off the back of the ledge of the slot of an opposing leg as the shelf is loaded into the tower, thereby passively interlocking the shelf with the opposing legs.

2. The shelves of claim 1, comprising polycrystalline silicon.

3. The shelves of claim 2, consisting essentially of randomly oriented polycrystalline silicon.

4. A shelf tower for supporting a plurality of substrates for thermal processing in a thermal processing furnace, comprising:
    two bases;
    a plurality of legs extending along a first axis, fixed to the two bases and having slots formed along the legs, the slots of two opposing legs having raised ledges; and
    a plurality of shelves individually detachably loaded along a second axis perpendicular to the first axis into respective sets of the slots and configured to support respective substrates in a thermal processing furnace and individually detachably and passively interlocked with two of the legs opposing each other by movements of the shelves along the first axis, wherein each shelf comprises two opposed flattened outer lateral sides extending parallel to the second axis, the opposed flattened outer lateral sides each including a step, wherein each step falls off the back of the ledge of the slot of an opposing leg as the shelf is loaded, thereby passively interlocking the shelf with the opposing legs.

5. The shelf tower of claim 4, wherein the shelves comprise a material selected from the group of quartz, silicon carbide, and silicon-impregnated silicon carbide.

6. The shelf tower of claim 5, wherein the legs comprise structural members comprising elemental silicon.

7. The shelf tower of claim 4, wherein the shelves comprise structural members comprising elemental silicon.

8. The shelf tower of claim 7, wherein the elemental silicon comprises randomly oriented polycrystalline silicon.

\* \* \* \* \*